(12) United States Patent
Hattori

(10) Patent No.: US 6,296,336 B1
(45) Date of Patent: Oct. 2, 2001

(54) WATER-PROOF STRUCTURE FOR USE WITH A FRAME BODY

(75) Inventor: Takeshi Hattori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/323,048

(22) Filed: Jun. 1, 1999

(30) Foreign Application Priority Data

Jun. 1, 1998 (JP) .................................................. 10-151509

(51) Int. Cl.⁷ ..................................................... A47B 96/00
(52) U.S. Cl. ........................... 312/296; 220/378; 220/806
(58) Field of Search ..................................... 220/378, 806; 277/451, 608, 614, 616, 628; 312/296

(56) References Cited

U.S. PATENT DOCUMENTS

| 4,854,476 | * | 8/1989 | Serio, Jr. ............................ | 220/378 X |
| 4,881,659 | * | 11/1989 | Uchiyama et al. ............... | 220/378 X |
| 5,875,916 | * | 3/1999 | Crockett, Sr. et al. ........... | 220/806 X |

FOREIGN PATENT DOCUMENTS

| 58-31598 | 2/1983 | (JP) . |
| 60-13780 | 1/1985 | (JP) . |
| 60-45479 | 3/1985 | (JP) . |
| 3-94516 | 9/1991 | (JP) . |
| 4-17359 | 1/1992 | (JP) . |
| 8-34467 | 2/1996 | (JP) . |

* cited by examiner

Primary Examiner—Carl D. Friedman
Assistant Examiner—Kevin D. Wilkens
(74) Attorney, Agent, or Firm—Foley & Lardner

(57) ABSTRACT

A frame body water-proof structure, has a main frame body, a frame cover, a loop-shaped elastic packing element, and four securing screws for fixing the frame cover on to the main frame body. A wall portion is formed along a periphery edge portion on an engaging surface of the main frame body, and a shoulder portion is formed continuously in connection with the wall portion. The packing element is attached around the outer periphery surface of the wall portion and mounted on the shoulder portion. A recess portion is formed on the inner side of the periphery edge portion on an engaging surface of the frame cover. The recess portion also including a shoulder portion. When the recess portion of the frame cover is engaged on to the outer periphery surface of the wall portion of the main frame body, a space for accommodating the packing element is formed as defined by the recess portion of the frame cover, the outer periphery surface of the wall portion, and the shoulder portion of the main frame body, such that as soon as the frame cover is fixed on to the main frame body by the four securing screws, the packing element is elastically deformed so as to seal the space.

8 Claims, 3 Drawing Sheets

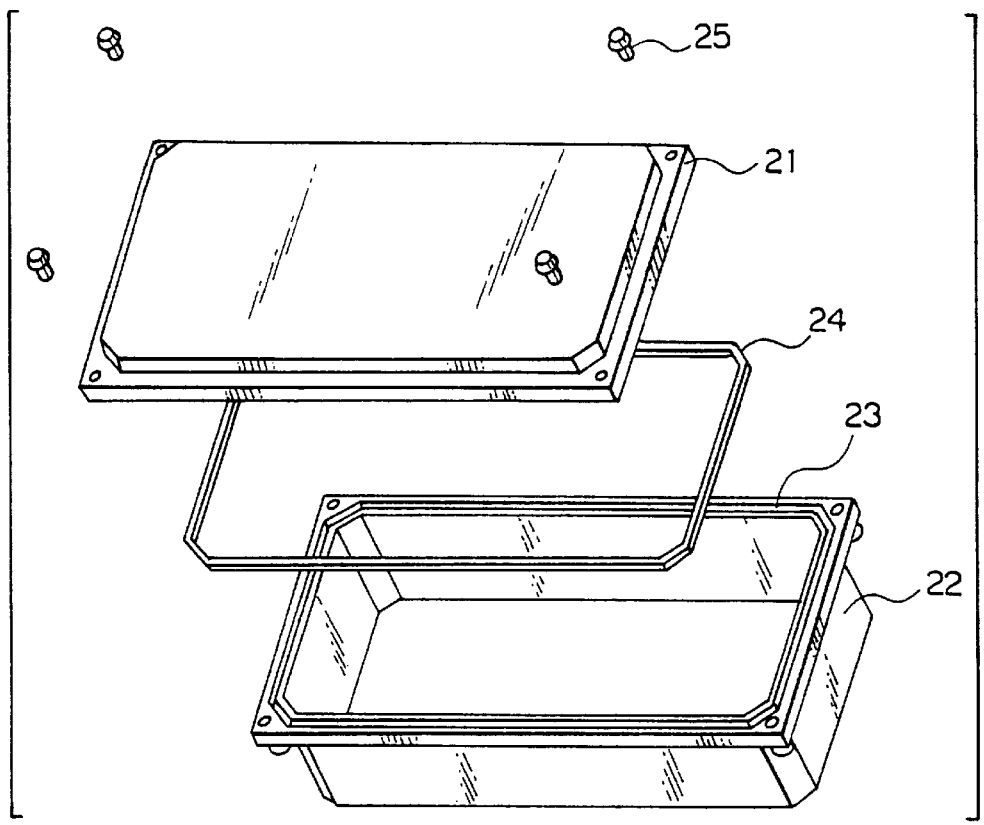
FIG. 2A PRIOR ART
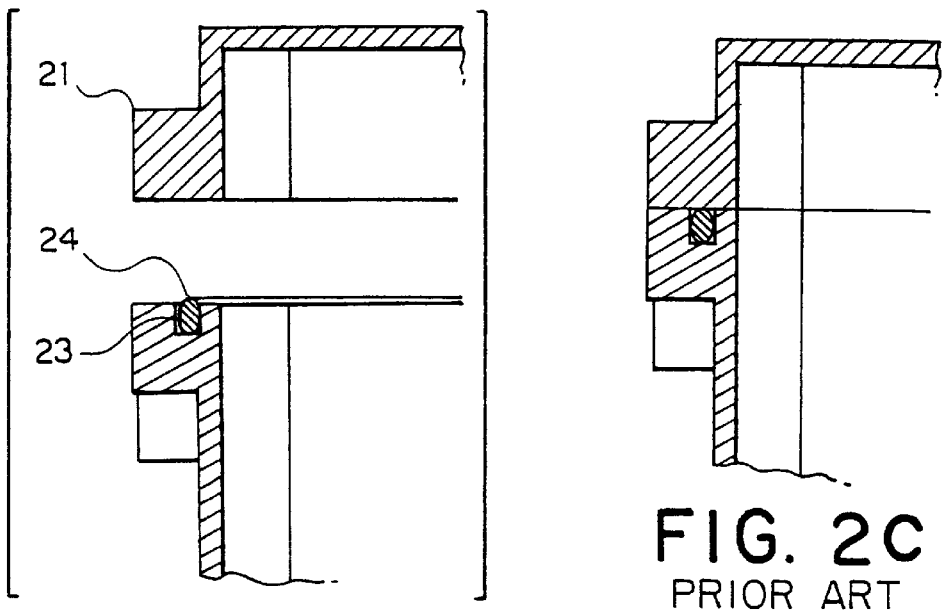
FIG. 2B PRIOR ART
FIG. 2C PRIOR ART

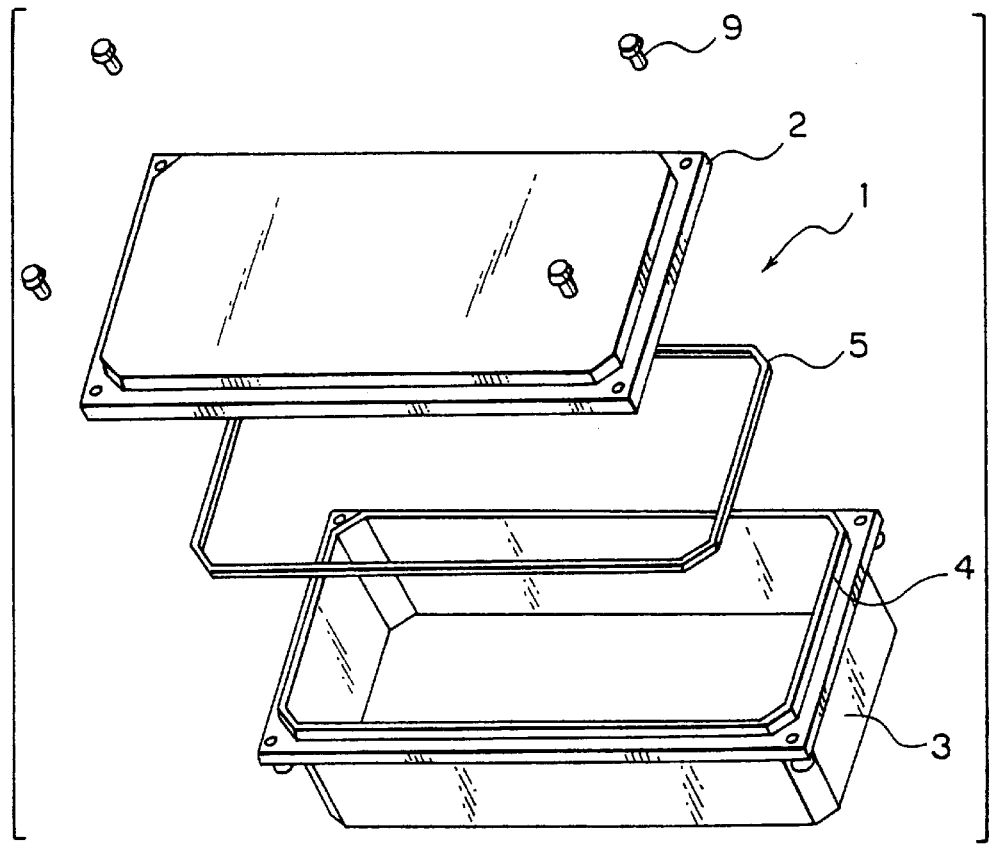
FIG. 3A
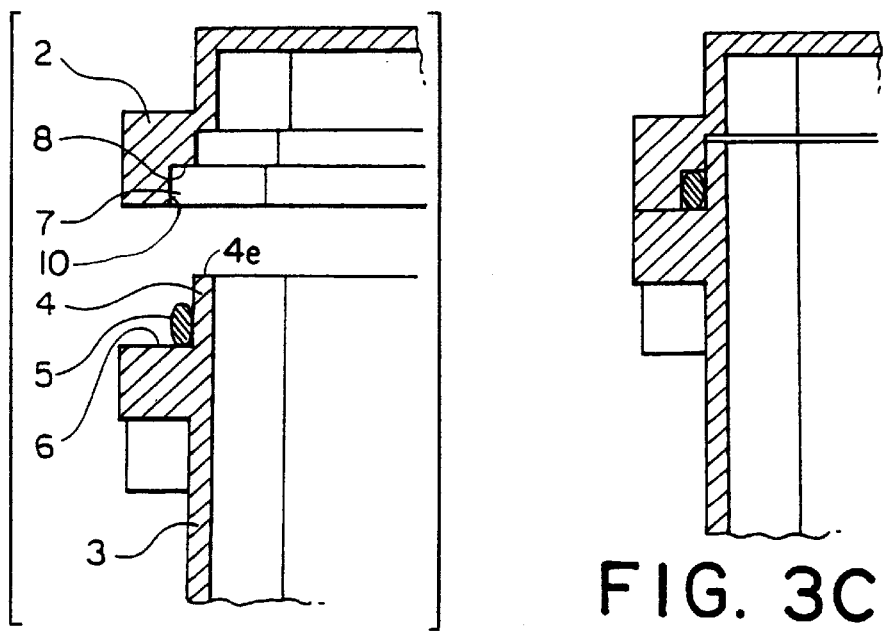
FIG. 3B
FIG. 3C

WATER-PROOF STRUCTURE FOR USE WITH A FRAME BODY

BACKGROUND OF THE INVENTION

The present invention relates to a water-proof structure for use with a frame body, in particular, this invention relates to a water-proof structure having a packing element. Such kind of a water-proof structure is effective when being used with a frame body which is usually installed in an outdoor environment.

In the past, a waterproof structure for use in protecting an equipment is a type as disclosed in Japanese Unexamined Patent Publication (JP-A) No. 17359 of 1992, which is constructed for the purpose of performing a water-cooling type of heat radiation for a semiconductor apparatus. FIGS. 1A and 1B are views schematically indicating an example of a water-proof structure made according to a prior art. In the drawings, a heat radiator 35 has a water path (now shown) which is formed to allow the flowing of water therethrough, so that the heat from a semiconductor within a cover 33 is allowed to conduct through a metal base 34 so as to be transferred to the outside. Further, the heat radiator 35 has a frame-like sealing element 31 secured on one surface thereof. Such a sealing element 31 has a certain elasticity so that the sealing element 31 itself may be pressingly secured on the cover 33 close to the lower edge projection 32 thereof formed along the lower edge of the cover 33. In this manner, a water drop 3A attached on the heat radiator 35 may be prevented from invading into the cover 33.

However, the above conventional waterproof structure has some problems in relation to a durability and external appearance, thus it is not suitable for use in a portable apparatus, nor is it appropriate to be used in an outdoor environment. As a result, such kind of a water-proof structure can not be used in the field of the present invention.

Further, another conventional water-proof structure for use in a portable apparatus or in an outdoor environment, is constructed by embedding a frame cover into a frame main body with a packing element interposed therebetween, so as to obtain a desired water-proof structure. FIGS. 2A and 2B are views schematically indicating an example of a water-proof structure involving the use of packing element. As shown in FIGS. 2A and 2B, this is a waterproof structure formed by embedding a frame cover 21 into a main frame body 22 with a packing element 24 interposed therebetween. In detail, a groove 23 having a square frame configuration is formed on the sealing edge portion of the main frame body 22, a packing element 24 having a similar square frame configuration is inserted in the groove 23, the cover 21 is then engaged on to the sealing edge portion of the main frame body 22. Finally, four screws 25 are used to fix the cover 21 on the main frame body 22, thereby obtaining and maintaining a desired water-proof structure. However, such a packing element 24 is apt to accidentally move out of the groove 23 when the cover 21 is closed on or taken off the main frame body 22. If the packing element 24 has left the groove 23, a desired water-proof property will be lost. In addition, another problem with the water-proof structure shown in FIGS. 2A and 2B is that an operation for the insertion of the packing element 24 into the groove 23 is relatively difficult.

On the other hand, a water-proof structure formed by interposing a packing element between the main frame body and the frame cover has been disclosed in Japanese Unexamined Patent Publication (JP-A) No. 31598 of 1983, Japanese Unexamined Utility Model Publication (JP-U) No. 94516 of 1991, and Japanese Unexamined Utility Model Publication (JP-U) No. 45479 of 1985, Japanese Unexamined Patent Publication (JP-A) No. 34467/1996, and Japanese Unexamined Utility Model Publication (JP-U) No. 13780 of 1985.

As discussed above, there are some problems associated with a water-proof structure involving the use of a packing element. A first problem is that, since a packing element is likely to be absorbed toward the frame cover when the frame cover is closed on or taken off the main frame body, causing the packing element to move away from the groove, resulting in a trouble that the packing element is only sandwiched between the main frame body and the frame cover, but losing a desired water-proof property. The loss of water-proof property is caused due to the following fact. Namely, the width of the groove formed on the sealing edge portion of the main frame body has a size including a packing width and a clearance. If the packing element has moved out of the groove and is simply sandwiched between the main frame body and the frame cover, a desired contact between the packing element and the groove wall will be lost, hence losing a desired water-proof property. Further, since the depth of the groove is less than the height of the packing element, a problem associated therewith is that the packing element is apt to move away from the groove. A second problem is that the packing element is difficult to be inserted into the groove formed on the sealing edge portion of the main frame body. Accordingly, an operation for assembling such a water-proof structure is hard to be performed with a high efficiency. As a result, there is a possibility that the packing element can be inserted into the groove with a wrong manner, making it difficult to maintain a desired water-proof property. A reason responsible for the second problem is that it is difficult to vertically insert the packing element into the groove formed on the sealing edge portion of the main frame body.

SUMMARY OF THE INVENTION

It is an object of the present invention to provide a water-proof structure for use with a frame body, which is capable of preventing an undesired movement of a packing element away from the frame body during the opening and closing thereof.

It is another object of the present invention to provide a water-proof structure for use with a frame body, which allows a packing element to be easily attached in position in a correct manner.

According to the present invention, there is provided a frame body water-proof structure, having a main frame body, a frame cover, a loop-shaped elastic packing element, and securing means for fixing the frame cover on to the main frame body. Further, a wall portion is formed along a periphery edge portion on an engaging surface of the main frame body, and a shoulder portion is formed continuously in connection with the wall portion. In particular, the packing element is attached around the outer periphery surface of the wall portion and mounted on the shoulder portion. Moreover, a recess portion is formed on the inner side of the periphery edge portion on an engaging surface of the frame cover, the recess portion also including a shoulder portion. In this way, when the recess portion of the frame cover is engaged on to the outer periphery surface of the wall portion of the main frame body, a space for accommodating the packing element is formed as defined by the recess portion of the frame cover, the outer periphery surface of the wall portion, and the shoulder portion of the main frame body, such that as soon as the frame cover is fixed on to the main frame body by the securing means, the packing element is elastically deformed so as to seal the space.

BRIEF DESCRIPTION OF THE DRAWINGS

FIG. 2A is an exploded perspective view schematically indicating a water-proof structure for use with a frame body, which water-proof structure employs a packing element made according to a prior art.

FIGS. 2B and 2C are sectional views schematically indicating a water-proof structure, respectively illustrating a condition before a frame cover is engaged on to a main frame body and a condition after the frame cover has been engaged on to the main frame body, which water-proof structure is made according to a prior art.

FIG. 3A is an exploded perspective view schematically indicating a water-proof structure for use with a frame body, which water-proof structure employs a packing element made according to an embodiment of the present invention.

FIGS. 3B and 3C are sectional views schematically indicating a water-proof structure, respectively illustrating a condition before a frame cover is engaged on to a main frame body and a condition after the frame cover has been engaged onto the main frame body, which water-proof structure is made according the embodiment of the present invention.

DESCRIPTION OF THE PREFERRED EMBODIMENT

Figure 1A:
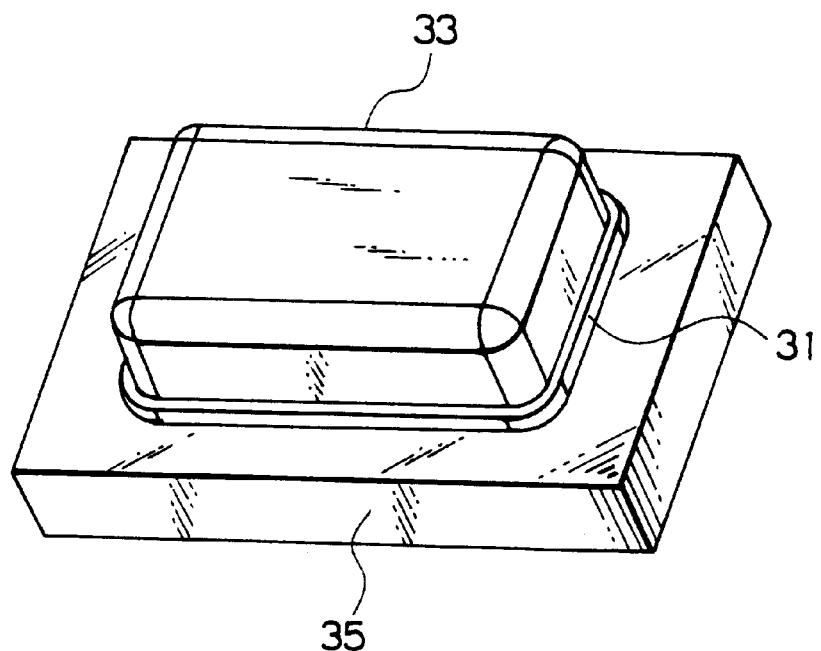
FIG. 1A is a perspective view schematically indicating a water-proof structure for use with a semiconductor apparatus, which water-proof structure employs a sealing element made according to a prior art.
Figure 1B:
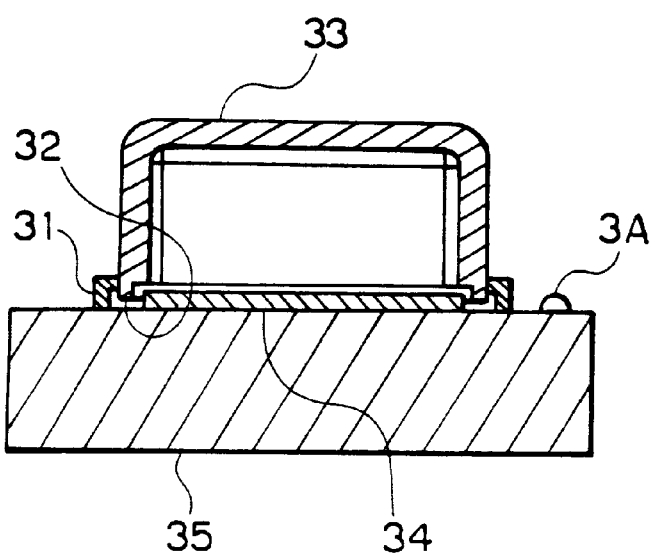
FIG. 1B is a sectional view schematically indicating a water-proof structure for use with a semiconductor apparatus, which water-proof structure employs a sealing element made according to a prior art.

In the following, one embodiment of the present invention will be described in detail with reference to the accompanying drawings. FIGS. 3A–3C are views schematically indicating a water-proof structure for use with a frame body, which water-proof structure is made according to the present invention. In detail, FIG. 3A is an exploded perspective view schematically indicating an entire arrangement of a water-proof structure, FIGS. 3B and 3C are sectional views schematically indicating an internal condition of the water-proof structure. As shown in FIG. 3A, a frame body 1 includes a frame cover 2 and a main frame body 3. The internal surface of the frame cover 2 adjacent to the lower edge portion thereof has a stepped surface 8, 10 formed by a shouldered recess portion 7 which is adapted to be engaged by an outer surface of a wall portion 4 protruding from the upper edge of the main frame body 3, thereby forming a sealed area between the outer surface of the wall portion 4 and the internal surface of frame cover 2. The stepped surface comprises a shoulder 8 and a packing-element engaging surface 10, with the use of four screws 9 secured through the frame cover 2 and the main frame body 3, a desired sealing structure is thus obtained. Further, an elastically deformable packing element 5 is tightly attached to the outer periphery surface of the wall portion 4 of the main frame body 3, thereby obtaining completely sealed section. In particular, the lower end face of the packing element 5 is engaged by a shoulder portion 6 continuously formed in connection with the outer periphery surface of the wall portion 4 of the main frame body 3.

With the frame body formed in the above manner, as soon as the frame cover 2 of the frame body 1 is engaged on to the main frame body 3, followed by fixing in position the four screws 9, the packing element 5 within the sealed section is pressed so as to obtain a water-proof effect. In this way, during an opening movement of the frame cover 2, even if there is a possibility that the packing element 5 has a tendency to be attached to the frame cover 2, such a packing element 5 may be prevented from slipping away from the main frame body 3 by being tightly fixed on the outer periphery surface of the wall portion 4 which has a sufficient height higher than the packing element 5. The wall portion 4 has a peripheral end 4e, which terminates substantially higher than the top of the packing element 5. Further, since the sealing section of the main frame body 3 only involves the wall portion 4, such a packing element 5 is allowed to be attached on to the outer periphery surface of the wall portion 4 with a great ease.

In the following, the operation of the frame body water-proof structure made according to the present invention will be described in detail with reference to FIG. 3A. As shown in FIG. 3A, the frame cover 2 and the main frame body 3 are caused to press the packing element 5 attached on the outer periphery surface of the wall portion 4, with the use of the four screws 9 inserted through the edge portions of the frame cover 2 and the main frame body 3 so as to be fixed in positions on the four corners thereof, thereby obtaining a predetermined desired water-proof structure.

Referring to FIGS. 3B and 3C, the packing element 5 has a height which has a larger size than its width, so as to obtain a large area in contact with the outer periphery surface of the wall portion 4, thereby enabling the packing element 5 to be firmly fit (not easy to move away) on the wall portion 4 by virtue of a friction force occurring between the packing element 5 and the wall portion 4. By making the inner size of the packing element 5 to be smaller than the outer size of the wall portion 4, it is allowed to obtain a large reaction force from the wall portion 4, thereby obtaining a large frictional force and thus ensuring a further improved sealing effect. Moreover, if the wall portion 4 has a height which is sufficiently higher than that of the packing element 5, the packing element 5 is sure to get in tight contact with the frame cover 2 during the opening and the closing of the frame body 1. In this way, even if the packing element 5 might be caused to deviate upwardly more or less, a contact area between the packing element 5 and the outer periphery surface of the wall portion 4 will remain the same, thereby ensuring that there would be no change in the frictional force caused between the two members, and thus effectively preventing the packing element 5 from moving away from the main frame body 3. Further, since the sealing section of the main frame body 3 includes nothing but the wall portion 4, the packing element 5 is allowed to be expanded so as to be easily attached around the wall portion 4 of the main frame body 3.

In the following, a concrete embodiment of the present invention will be described in detail with reference to the accompanying drawings. Referring to FIGS. 3A–3C, the frame body 1 is used as a radio base station which is to be established in an outdoor environment, such a frame body 1 is comprised of a main frame body 3 and a frame cover 2 which is allowed to be opened off and closed on the main frame body 3. The frame cover 2 and the main frame body 3 cooperate with each other to form a sealing section by securing four screws 9 in positions. Along the entire length of the sealing section of the main frame body 3 is provided the wall portion 4, the outer periphery surface of such wall portion 4 is tightly surrounded by a loop-shaped packing element 5 which is made of a silicone material capable of being expandable and deformable. Such a radio base station is formed so that, as soon as the frame cover 2 and the main frame body 3 get engaged with each other by securing four screws 9 in positions, the shoulder portion 8 of the recess portion 7 formed on the inner surface of the frame cover 2 will press against the silicone packing element 5, thereby obtaining a desired water-proof property by virtue of a reaction force of the silicone material. Further, even if there is a tendency that the packing element 5 will be pulled and thus be attached to the frame cover 2 when the cover 2 is being opened, such a packing element 5 can be substantially prevented from moving away from its predetermined position on the outer periphery surface of the wall portion 4, provided that the packing element 5 has a height of 6 mm and the wall portion 4 has a height of 10 mm. In addition, since the sealing section of the main frame body 3 involves merely the provision of the wall portion 4, the packing element 5 may be expanded so as to be easily attached on to the outer periphery surface of the wall portion 4.

The operation of the frame body water-proof structure of the present invention will be described in detail below with reference to the accompanying drawings.

Referring again to FIG. 3A, upon securing the four screws 9 in positions, the frame cover 2 and the main frame body 3 of the radio base station can be caused to press against the silicone packing element 5 firmly attached on to the outer periphery surface of the wall portion 4, thereby obtaining a desired water-proof property by virtue of a reaction force produced by the silicone packing element 5. Moreover, referring again to FIGS. 3B and 3C, if the packing element 5 has a width of 4 mm, a height of 6 mm, and its corner curvature semi-diameter R is 1 mm, the packing element 5 will have a contacting height of 6 mm in contact with the wall portion 4, thereby obtaining a sufficient frictional force which is useful in preventing the packing element 5 from slipping away from the predetermined position on the outer periphery surface of the wall portion 4. In this way, if the inner size of the loop-shaped packing element 5 is made to be smaller than the outer size of the wall portion 4, it is allowed to obtain a larger reaction force from the packing element 5 and thus get an increased frictional force, thereby obtaining a further improved water-proof effect. In particular, an off-set value (a contraction value) of the inner size of the packing element 5 is preferred to be 0.5 mm. Further, the wall portion 4 may be set to have a height of 10 mm, while the packing element 5 may have a height of 6 mm, and is preferred to have a contact height of 4 mm in contact with the wall portion 4. In this manner, during a moment when the frame body 1 is being opened, although the packing element 5 has a tendency to get tight contact with the frame cover 2 so as to be moved upwardly more or less, such a movement may be inhibited in a desired manner. Namely, if such an upward movement of the packing element 5 is within a range of only 5 mm or less, a contacting area between the inner surface of the packing element 5 and the outer periphery surface of the wall portion 4 will remain the same, thereby causing no change in a desired predetermined frictional force, and thus exactly preventing the packing element 5 from moving away from the main frame body 3.

Further, since the sealing section of the main frame body 3 involves merely the provision of the wall portion 4, the packing element 5 may be expanded easily on to the outer periphery surface of the wall portion 4.

With the use of the present invention, it is allowed to obtain the following two effects.

As the first effect of the present invention, during a moment when the frame body is being opened, it is sure to prevent the packing element from being attached to the frame cover so as to prevent it from moving away from a predetermined position. In this way, the packing element may be prevented from being jammed into any other positions than a predetermined position between the frame cover and the main frame body, thereby maintaining a desired water-proof effect for the whole frame body. The reason for this effect may be explained as follows. Namely, the packing element has a height which is larger in size than its width, thereby ensuring a large contacting area between the packing element and the wall portion in the sealing section of the main frame body. Therefore, the packing element may be exactly prevented from moving away from a predetermined position by virtue of a frictional force produced between the packing element and the outer periphery surface of the wall portion. Moreover, the wall portion of the sealing section of the main frame body has been made sufficiently higher than that of the packing element. Thus, although the packing element might move upwardly more or less, a contacting area between the inner surface of the packing element and the outer periphery surface of the wall portion will remain the same, thereby causing no change in a desired predetermined frictional force, and thus exactly preventing the packing element from moving away from the main frame body.

As the second effect of the present invention, the packing element is allowed to be easily attached on to the sealing section of the main frame body. In this way, the packing element will never be attached in a wrong manner, thereby maintaining a desired water-proof property for the frame body. The reason for this effect may be explained as follows. Namely, since the sealing section of the main frame body involves merely the provision of the wall portion, the packing element may be expanded so as to be easily attached on to the outer periphery surface of the wall portion.

What is claimed is:

1. A frame body water-proof structure comprising:
   a main frame body, a frame cover, a loop-shaped elastic packing element, and securing means for fixing said frame cover on to said main frame body,
   wherein the frame body has a wall portion and a shoulder portion extending laterally outwardly contiguously from said wall portion,
   wherein said packing element is situated around an outer peripheral surface of said wall portion and is seated on said shoulder portion, said wall portion being substantially taller than the height of said packing element;
   wherein said frame cover has a recess portion forming a shoulder and an engaging surface on an inner peripheral edge portion of said frame cover,
   wherein said shoulder and said engaging surface of said frame cover and said outer peripheral surface of said wall portion and said shoulder of said main frame body form a space for accommodating said packing element, said shoulder and said engaging surface of said frame cover and said outer peripheral surface of said wall portion and said shoulder of said main frame body enclosing, engaging, and elastically deforming said packing element when said frame cover is fixed on to said main frame body by said securing means.

2. A frame body water-proof structure as claimed in claim 1, wherein said packing element is stretched around said wall portion.

3. A frame body water-proof structure as claimed in claim 1, wherein said packing element is made of a silicone material.

4. A frame body water-proof structure as claimed in claim 1, wherein said height of said packing element greater than the width of said packing element.

5. A water-proof structure comprising:

a main frame body having a wall portion terminating in a peripheral end and a shoulder portion extending, laterally outwardly contiguously from the wall portion and below the peripheral end of the wall portion;

a frame cover having a stepped surface, a loop-shaped elastic packing element situated around the wall portion and seated on the shoulder portion, the wall portion being substantially taller than the height of the packing element so that the peripheral end is situated substantially above a top portion of the packing element; and fasteners for securing the frame cover on to the main frame body, wherein the stepped surface of the frame cover and portions of the wall portion and the shoulder of the main frame body form a space that accommodates the packing element, the stepped surface of the frame cover and the portion of the wall portion and the shoulder of the main frame body enclosing, engaging, and elastically deforming the packing element when the frame cover is secured on to the main frame body with the fasteners.

6. A water-proof structure as claimed in claim 5, wherein the packing element is stretched around the wall portion.

7. A water-proof structure as claimed in claim 5, wherein said packing element is made of a silicone material.

8. A water-proof structure as claimed in claim 5, wherein the height of the packing element is greater than that the width of the packing element.

* * * * *